US008432691B2

(12) United States Patent
Toftloekke et al.

(10) Patent No.: US 8,432,691 B2
(45) Date of Patent: Apr. 30, 2013

(54) LIQUID COOLING SYSTEM FOR AN ELECTRONIC SYSTEM (75) Inventors: Mikkel Block Toftloekke, Brønderslev (DK); Peter Lykke, Aalborg (DK); Poul Hove Kristensen, Aabybro (DK)

(73) Assignee: Asetek A/S, Bronderslev (DK)

( * ) Notice: Subject to any disclaimer, the term of this patent is extended or adjusted under 35 U.S.C. 154(b) by 163 days.

(21) Appl. No.: 12/914,263

(22) Filed: Oct. 28, 2010

(65) Prior Publication Data
US 2012/0106083 A1 May 3, 2012

(51) Int. Cl.
*H05K 7/20* (2006.01)
(52) U.S. Cl.
USPC .......... 361/698; 361/679.46; 361/679.53; 361/679.55; 361/699; 165/80.2; 165/80.4; 165/80.5; 165/104.21; 165/185; 62/3.7; 62/259.2
(58) Field of Classification Search ............ 361/679.46–679.54, 688, 689–712, 361/717–728; 165/80.2, 80.3, 80.4, 80.5, 165/104.21, 185; 62/259.2, 3.7
See application file for complete search history.

(56) References Cited

U.S. PATENT DOCUMENTS

| 5,144,531 | A | * | 9/1992 | Go et al. ....................... 361/702 |
| 5,271,239 | A | * | 12/1993 | Rockenfeller et al. ........ 62/259.2 |
| 5,420,753 | A | | 5/1995 | Akamatsu et al. |
| 5,509,468 | A | * | 4/1996 | Lopez ........................... 165/144 |
| 5,966,957 | A | * | 10/1999 | Malhammar et al. ........ 62/259.2 |
| 6,111,749 | A | * | 8/2000 | Lamb et al. .................... 361/699 |
| 6,152,213 | A | * | 11/2000 | Suzuki ..................... 165/104.33 |
| 6,966,363 | B2 | * | 11/2005 | Gailus et al. ................... 165/185 |
| 6,989,990 | B2 | * | 1/2006 | Malone et al. ................. 361/699 |
| 7,055,341 | B2 | * | 6/2006 | Nori et al. ...................... 62/259.2 |
| 7,120,021 | B2 | * | 10/2006 | Hamman ....................... 361/699 |
| 7,325,588 | B2 | * | 2/2008 | Malone et al. ............... 165/80.2 |
| 7,372,698 | B1 | * | 5/2008 | Tilton et al. .................... 361/701 |
| 7,615,303 | B2 | * | 11/2009 | Lee ................................ 429/428 |
| 7,630,856 | B2 | * | 12/2009 | Rockenfeller et al. ........ 702/132 |

(Continued)

FOREIGN PATENT DOCUMENTS

JP 2007-272294 10/2007
WO WO 2008/133101 11/2008

OTHER PUBLICATIONS

International Search Report and Written Opinion for corresponding International application No. PCT/IB2010/002906, dated Aug. 19, 2011.

(Continued)

*Primary Examiner* — Michail V Datskovskiy
(74) *Attorney, Agent, or Firm* — Finnegan, Henderson, Farabow, Garrett & Dunner LLP (57) ABSTRACT A liquid cooling system for an electronic system includes a plurality of cooling modules that are adapted to circulate a liquid coolant therethrough. Each cooling module is configured to be coupled to a circuit board of the electronic system and placed in thermal contact with one of a plurality of heat-generating electronic components on the circuit board. The cooling system also includes a plurality of heat exchangers that are configured to dissipate heat from the liquid coolant to air. Each heat exchanger of the plurality of heat exchangers is fluidly coupled between two cooling modules of the plurality of cooling modules in a flow path of the liquid. The cooling system also includes a plurality of conduits that fluidly couple the plurality of cooling modules to the plurality of heat exchangers.

20 Claims, 6 Drawing Sheets

U.S. PATENT DOCUMENTS

| | | | |
|---|---|---|---|
| 2004/0184237 A1* | 9/2004 | Chang | 361/699 |
| 2005/0178526 A1* | 8/2005 | Naganawa et al. | 165/80.2 |
| 2005/0230080 A1* | 10/2005 | Paul et al. | 165/47 |
| 2005/0243517 A1* | 11/2005 | Malone et al. | 361/699 |
| 2006/0120036 A1* | 6/2006 | Rockenfeller | 361/688 |
| 2006/0187638 A1* | 8/2006 | Vinson et al. | 361/698 |
| 2007/0039719 A1 | 2/2007 | Eriksen | |
| 2007/0060604 A1* | 3/2007 | Khanuja et al. | 514/288 |
| 2008/0156463 A1* | 7/2008 | Chereau | 165/80.4 |
| 2008/0223552 A1 | 9/2008 | Onishi | |
| 2008/0230208 A1 | 9/2008 | Rasmussen | |
| 2008/0259566 A1* | 10/2008 | Fried | 361/699 |
| 2009/0009968 A1* | 1/2009 | Hongo | 361/699 |
| 2009/0056911 A1* | 3/2009 | Hongo | 165/80.4 |
| 2009/0218072 A1 | 9/2009 | Eriksen | |

OTHER PUBLICATIONS

International Search Report and Written Opinion for related International application No. PCT/US2010/054457, dated Aug. 8, 2011.

New Application entitled "Integrated Liquid Cooling System", filed Oct. 28, 2010, (33 pages).

* cited by examiner

FIG. 6B

LIQUID COOLING SYSTEM FOR AN ELECTRONIC SYSTEM

TECHNICAL FIELD

The present invention is related generally to a liquid cooling system for cooling electronic components within a console.

BACKGROUND

Electronic systems, such as, for example, computers include IC (integrated circuit) devices or IC chips that generate heat during operation. With the advent of VLSI (very large scale integration) technology, the heat generation of IC devices has increased significantly with every new generation. As a result, the semiconductor industry is facing the problem of fast removal of heat from IC devices and from electronic systems that use these devices. While the problem of heat removal from IC devices is an old one, it has gained prominence in recent years due to increasing numbers of transistors that are packed into a single IC device while reducing the physical size of the device. Increasing number of transistors compacted into a smaller area results in a greater concentration of heat that must be removed from that smaller area. Heat must be removed from these IC devices in order to keep the devices within their safe operating temperatures. Historically, heat sinks with associated fans have been used to remove heat from the IC devices of computers. However, as heat generation of IC devices and cooling requirements of computers increase, liquid cooling solutions are being adopted to keep device temperatures and fan noise within acceptable levels.

Liquid cooling systems circulate a liquid coolant in a closed loop to transfer heat from heat-generating electronic devices to the ambient air. The liquid cooling system circulates a liquid through a heat sink or a heat transfer module attached to one or more electronic devices of the electronic system. As the liquid passes through the heat sink, heat is transferred from a hot IC device to the cooler liquid. The hot liquid then moves out to a radiator positioned in the electronic system (such as, for example, at the back of the computer case or console) to transfers the heat to ambient air. The cooled liquid then travels back through the system to the IC device to continue the process. A liquid cooling system, typically includes components, such as, one or more heat sinks (or heat transfer modules) to transfer heat from the IC devices to the coolant, one or more radiators or heat exchangers to dissipate heat from the coolant, a pump to circulate the coolant within the system, a reservoir to hold a sufficient quantity of the coolant, and tubing to fluidly couple the different components. To accommodate these components, liquid cooling systems typically require a relatively large amount of space within the console. Therefore, liquid cooling systems have more commonly been used in servers and relatively large desktop computer systems where space is not a constraint. Applying a liquid cooling system to space-constrained systems (such as, smaller desktops, notebook computers, and other small electronic systems), is however, challenging.

Furthermore, liquid cooling systems require a significant level of technical knowledge to install. Since the layout of IC devices within the console of an electronic system varies widely, a liquid cooling system typically has to be custom-fitted within a console. That is, tubes must be cut and routed to direct the coolant to different IC devices while making use of the available space within the console. This need for custom routing increases the likelihood of improper installation of the cooling system that could result in leakage of the coolant within the console. Coolant leaks may cause catastrophic damage to IC devices.

The disclosed liquid cooling systems are directed at overcoming these and/or other shortcomings in existing technology.

SUMMARY OF THE DISCLOSURE

In one aspect, a liquid cooling system for an electronic system is disclosed. The cooling system includes a plurality of cooling modules that are adapted to circulate a liquid coolant therethrough. Each cooling module is configured to be coupled to a circuit board of the electronic system and placed in thermal contact with one of a plurality of heat-generating electronic components on the circuit board. The cooling system also includes a plurality of heat exchangers that are configured to dissipate heat from the liquid coolant to air. Each heat exchanger of the plurality of heat exchangers is fluidly coupled between two cooling modules of the plurality of cooling modules in a flow path of the liquid. The cooling system also includes a plurality of conduits that fluidly couple the plurality of cooling modules to the plurality of heat exchangers.

In another aspect, a portable electronic device is disclosed. The device includes a console and a circuit board positioned within the console. The circuit board includes a plurality of heat-generating electronic components thereon. The device also includes a plurality of cooling modules coupled to the motherboard in thermal contact with a plurality of heat generating components on the motherboard. Wherein each cooling module of the plurality of cooling modules is configured to circulate a liquid coolant therethrough. The device also includes a plurality of heat exchangers fluidly coupled to the plurality of cooling modules and adapted to dissipate heat from the liquid coolant to air. Each heat exchanger of the plurality of heat exchangers is fluidly coupled between two cooling modules of the plurality of cooling modules in the flow path of the liquid coolant.

In yet another aspect, a liquid cooling system for an electronic system is disclosed. The cooling system includes a plurality of cooling modules that are configured to be coupled to a circuit board of the device and placed in thermal contact with a plurality of heat-generating electronic components on the circuit board. Wherein each cooling module of the plurality of cooling modules is adapted to circulate a liquid coolant therethrough. The cooling system also includes a plurality of heat exchangers that are fluidly coupled to the plurality of cooling modules. The plurality of heat exchangers are configured to dissipate heat from the plurality of heat generating components to air. Each heat exchanger of the plurality of heat exchangers is fluidly coupled between two cooling modules of the plurality of cooling modules in a flow path of the liquid coolant. Wherein each heat exchanger of the plurality of heat exchangers includes a first surface having parallel plates that are configured to be at least partially submerged in the liquid coolant and a second surface opposite the first surface having separate parallel plates that are exposed to air.

DETAILED DESCRIPTION

The following detailed description illustrates the liquid cooling system by way of example and not by way of limitation. Although the description below describes an application of the liquid cooling system to a portable computer, embodiments of the disclosed cooling systems may be applied to cool a heat generating component in any application (such as, for example, an ebook reader, a gaming console, a mainframe computer, a switching system of a communication network, etc.). The description enables one skilled in the art to make and use the present disclosure for cooling any electronic component within a console.

Figure 1:
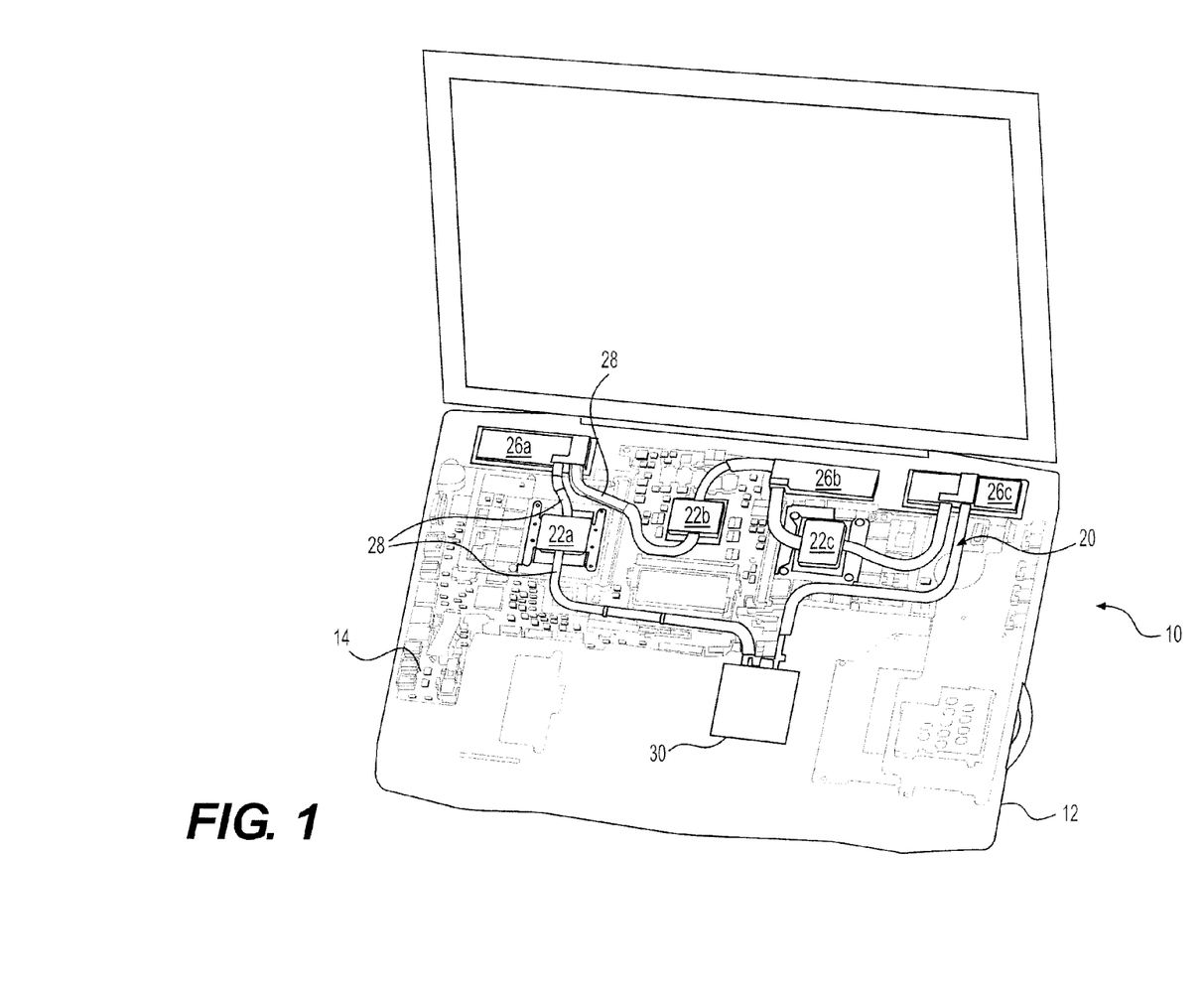
FIG. 1 is an illustration of an embodiment of the disclosed liquid cooling system applied to a portable computer.

FIG. 1 illustrates an embodiment of a liquid cooling system 20 used to cool IC devices of a portable computer 10. Although a computer is used to illustrate the various aspects of the disclosed liquid cooling system, it should be emphasized that this is only exemplary. As discussed earlier, the liquid cooling system can be applied to any electronic system. In FIG. 1, the keyboard face of computer 10 has been removed to show cooling system 20 positioned within console 12 of computer 10. Computer 10 may include several IC devices and other electronic components, such as CPUs (central processing units), GPU (graphics processing units), memory devices, memory controllers, power supplies, etc. that generate heat during operation. Several of these heat generating IC devices (not visible in FIG. 1) may be coupled to a motherboard 14 or another circuit board of computer 10. As is known in the art, motherboard 14 may include a circuit board, such as a printed circuit board (PCB), that electrically couples the IC devices together and provide connections for other peripherals, such as adapter cards, daughter cards, etc. Liquid cooling system 20 may include multiple components that are fluidly coupled together. These multiple components may include a plurality of cooling modules (such as, for example, first cooling module 22a, second cooling module 22b, and third cooling module 22c) and a plurality of heat exchangers (such as, for example, a first heat exchanger 26a, a second heat exchanger 26b, and a third heat exchanger 26c) that are fluidly coupled together using conduits 28. A liquid coolant may circulate in the liquid cooling system 20 between the cooling modules and the heat exchanger. Liquid cooling system 20 may also include one or more pump(s) 30 to assist in the circulation of the coolant in the cooling system. Any liquid coolant known in the art (such as, for example, water, alcohol, etc.) may be circulated through cooling system 20.

The cooling modules may be positioned on motherboard 14 (or on motherboard 14 and other circuit boards of computer 10) to be in thermal contact with the one or more heat generating IC devices of computer 10. During operation, heat from these IC devices may be transferred to the cooling module that are in thermal contact with them. The coolant that circulates through the cooling module may transfer heat from the cooling modules to one or more heat exchangers that are fluidly coupled thereto. The heat exchangers may be positioned in computer 10 so as to enable heat from the coolant to be transferred to ambient air. Cooling system 20 may be dimensioned to fit within the available space of computer 10, and may be contoured to accommodate the components of computer 10 positioned around it, without hindrance. It should be noted, that although the cooled IC devices are described as being positioned on motherboard 14, this is not a requirement. For instance, the cooled IC devices may be positioned anywhere within computer 10, such as on a daughter card that is electrically coupled to a motherboard, etc. Also, although the cooled heat-generating electronic devices are described as being IC devices, any type of electronic device of computer 10 (or any other electronic system) may be cooled with cooling system 20.

Figure 2:
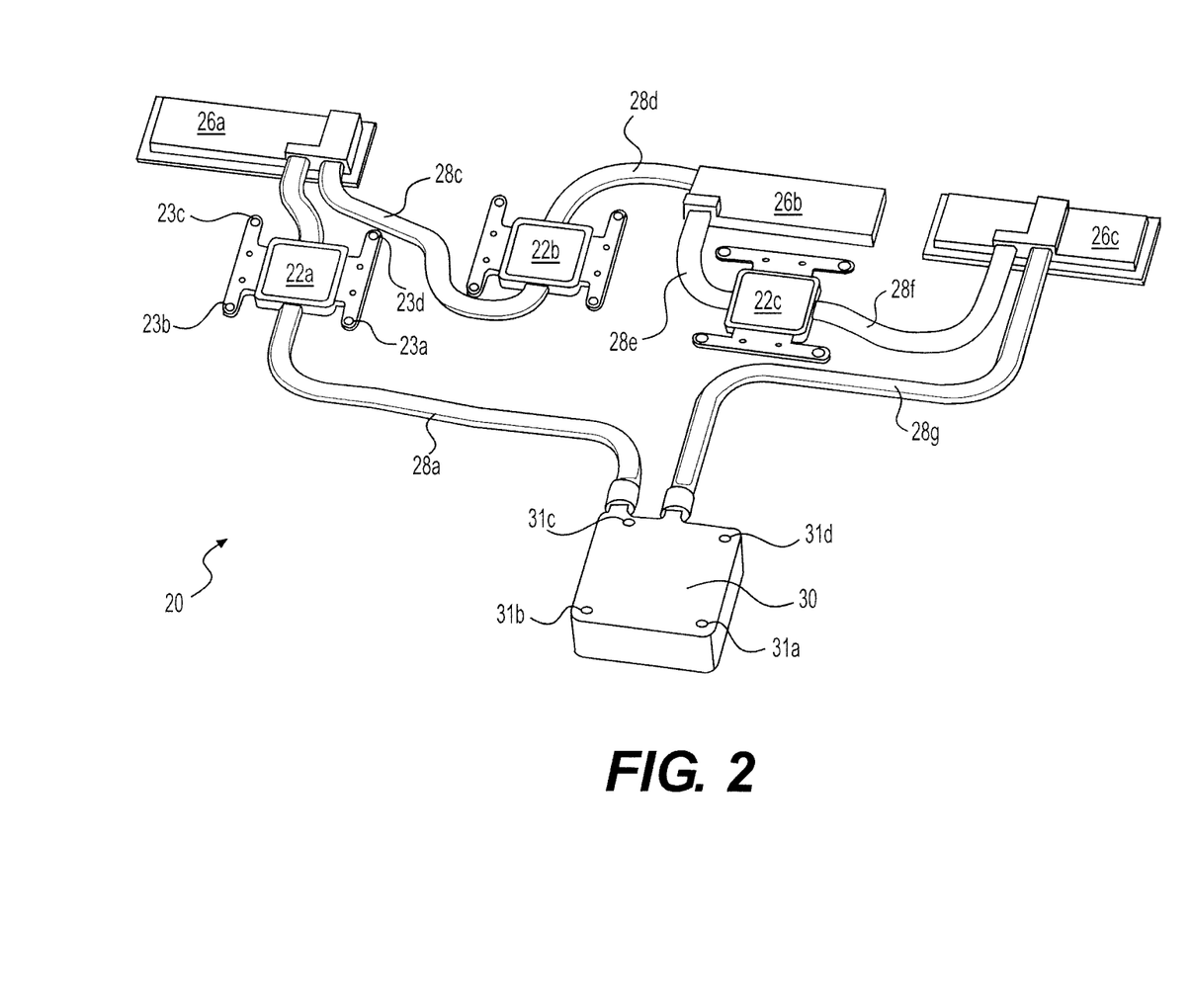
FIG. 2 is an illustration of an embodiment of the disclosed liquid cooling system.

FIG. 2 is an illustration of the cooling system 20 of FIG. 1 removed from computer 10. Cooling system 20 is comprised of several components that are coupled together to form an integrated system. In some embodiments, liquid cooling system 20 may be installed and removed from computer 10 as one single part (that is, as one integrated component). To install the cooling system as one single part, the cooling system with its cooling modules and heat exchangers fluidly coupled together may be aligned and placed on computer 10 (and motherboard 14) as one single part. The pump 30 may then be fluidly coupled to the cooling system. In some embodiments, the pump 30 may also be fluidly coupled to the cooling system when the cooling system is placed on the computer 10 as one single part. The cooling system 20 may include mounting features that align with attachment features on motherboard 14 and/or other circuit boards and console 12 of computer 10. For example, pump 30 may include through-holes 31a, 31b, 31c, and 31d proximate its four corners that align with mating features on motherboard 14, and first cooling module 22a may have attachment holes 23a, 23b, 23c, and 23d that align with mating attachment holes on motherboard 14. Fasteners or other attachment devices may pass through corresponding attachment holes on the cooling module and the motherboard to couple them together. These mounting features may be used to attach the cooling system 20 as one single part to the motherboard 14 and console 12. In the embodiment illustrated in FIG. 2, threaded screws may pass through one or more of attachment holes (23a, 23b, 23c, 23d, etc.) on the cooling modules to attach to mating features on motherboard 14. In another embodiment, some of the attachment holes may be used to attach cooling system 20 to motherboard 14 while other features (such as, for through-holes 31a, 31b, 31c, and 31d) may be used to attach cooling system 20 along with motherboard 14 to console 12. To remove the cooling system 20 from computer 10, these threaded screws may be removed, and the cooling system 20 lifted off the motherboard 14 as one single part. Although an attachment mechanism using threaded screws is illustrated herein, any attachment mechanism may be used to attach the cooling system 20 to computer 10. The ability to attach and detach the cooling system 20 to motherboard 14 as one single part may simplify installation of the cooling system on the computer since several components need not be separately attached to the motherboard and then fluidly coupled together.

However, attaching and detaching the cooling system 20 from the motherboard 14 as one single part is not a requirement, and in some embodiments, one or more components of the liquid cooling system 20 may be installed on the motherboard 14 separately. For instance, in some embodiments, the cooling modules and the heat exchangers may be attached separately to motherboard 14 and then fluidly coupled together by conduits (28a, 28b, etc.). Referring to FIG. 2, the constituent components of cooling system 20 include a first cooling module 22a, second cooling module 22b, third cooling module 22c, first heat exchanger 26a, second heat exchanger 26b, third heat exchanger 26c, and pump 30 fluidly coupled together using conduits 28a-28g. It should be emphasized that the cooling system 20 illustrated in FIG. 2 is only exemplary, and in general, a cooling system 20 of the current disclosure may include any number of components fluidly coupled together.

Figure 3:
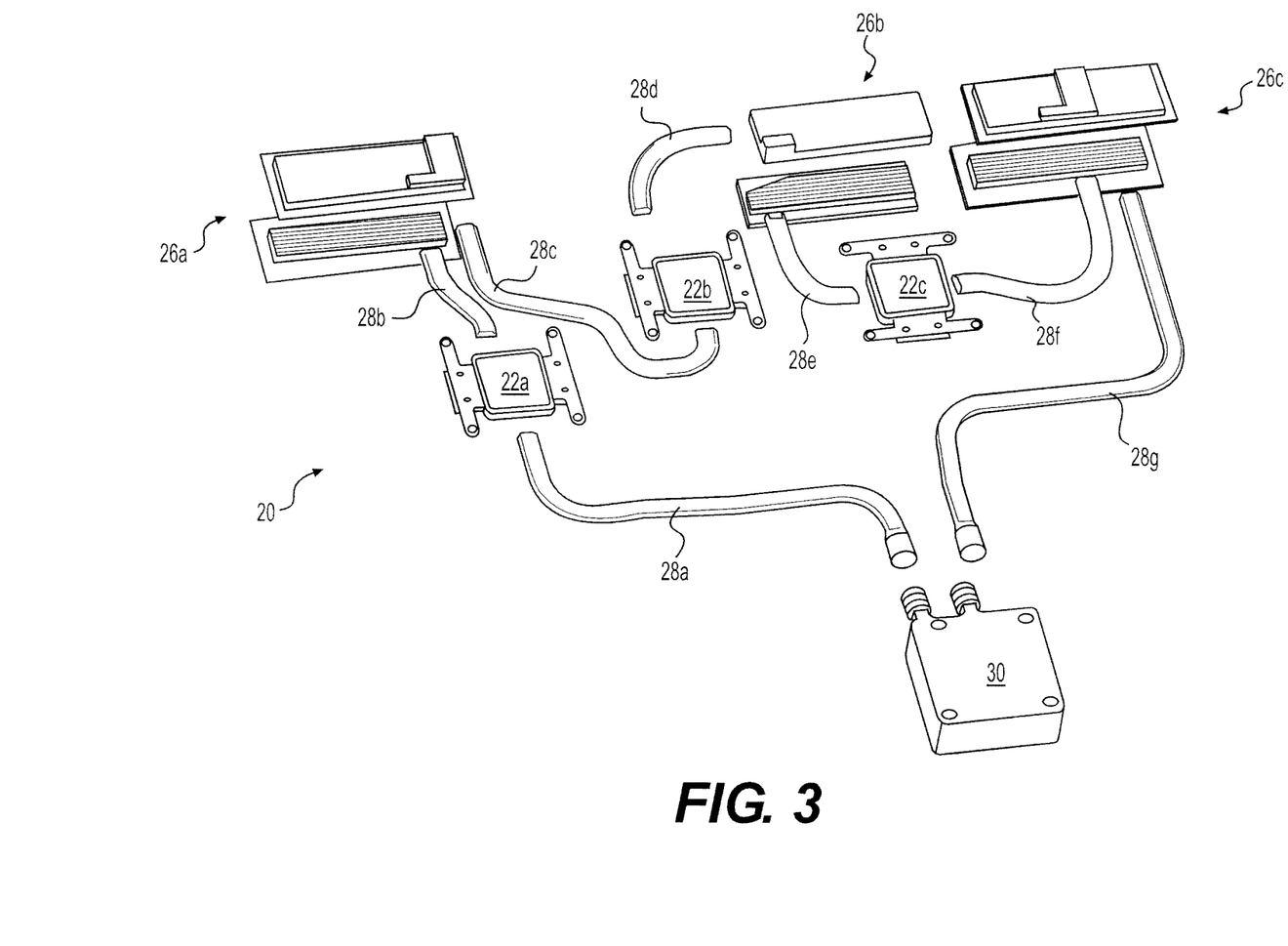
FIG. 3 is an illustration of an exploded view of the cooling system of FIG. 2.

FIG. 3 shows an exploded view of liquid cooling system 20 showing its constituent components decoupled from each other. First cooling module 22a, second cooling module 22b, third cooling module 22c of cooling system 20 are positioned in thermal contact with IC devices (heat-generating electronic components) of computer 10. Although not a requirement, first heat exchanger 26a, second heat exchanger 26b, and third heat exchanger 26c are typically positioned proximate an outer wall of console 12 (FIG. 1) to enable transfer of heat from the coolant circulating in cooling system 20 to the relatively cooler ambient air outside computer 10. The conduits that couple the cooling modules and the heat exchangers may be laid out such that the coolant may be transferred between these components efficiently without interfering with other components of computer 10. The layout of cooling system 20 may also be such that the heat absorbed by the coolant passing through one cooling module is dissipated in a heat exchanger before the coolant is directed to another cooling module. For instance, in the embodiment of cooling system 20 of FIGS. 2 and 3, first cooling module 22a may absorb heat from an IC device that it is in thermal contact with. A portion of this absorbed heat may get transferred to the coolant passing through the first cooling module 22a. Conduit 28b may direct this relatively hot coolant to first heat exchanger 26a. The first heat exchanger 26a may transfer a portion of the heat from the coolant to air, and thereby cool the coolant in first heat exchanger 26a. Conduit 28c will now direct this relatively cooler coolant to second cooling module 22b which is in thermal contact with (and absorbs heat from) another IC device of computer 10. While passing through the second cooling module 22b, the coolant may absorb a portion of the heat from the second cooling module 22b before being directed to second heat exchanger 26b through conduit 28d. The coolant may again be cooled in the second heat exchanger 26b before being directed to the third cooling module 22c to absorb more heat. Coolant from the third cooling module 22c may be cooled in third heat exchanger 26c before being directed to pump 30 to continue its circulation through cooling system 20.

Positioning a heat exchanger between two cooling modules in the coolant flow path allows the coolant that absorbed heat from a first cooling module to be cooled before it is directed to a second cooling module to absorb more heat. The cooler coolant absorbs more heat from the cooling module thereby increasing the heat transfer efficiency of the cooling module 20. Additionally, alternating a cooling module and a heat exchanger in the fluid flow path increases cooling efficiency by allowing the coolant to be cooled at multiple heat exchangers. For instance, in the embodiment illustrated in FIGS. 2 and 3, heat absorbed by the coolant while passing through cooling module 22a can be dissipated in the first, second, and third heat exchangers 26a, 26b, and 26c. This ability to dissipate heat at multiple heat exchangers may be especially useful where some IC devices emit a significantly higher amount of heat, or different components generate different amounts of heat (or their sensitivity to temperature is different) as is often the case in computers. For example, if the IC device that the first cooling module 22a is in contact with generates more heat than (or is more sensitive to heat than) the IC devices that the second and third cooling modules 22b and 22c are in contact with, the increase in temperature of the coolant while passing through the first cooling module 22a will be more than the increase in temperature while passing through the other two cooling modules. In such a scenario, the ability to dissipate the heat absorbed by the coolant in the first cooling module 22a at three different heat exchangers will enable the coolant to be cooled to a lower temperature before being circulated through the cooling system 20 again.

In general, the conduits 28 (28a-28g) may be made of any material and may have any size and shape. In some embodiments the conduits 28 may be made of a rigid material, such as a metal or a rigid plastic. Although not a requirement, fabricating the conduits out of a rigid material may make it easier for the cooling system 20 to be aligned and attached to the motherboard 14 as one single part. In some embodiments, the conduits 28 may be made of a high conductivity material (such as copper or aluminum). In these embodiments, the conduit 28 may also be used to cool electronic components of computer 10 by, for example, positioning the conduit 28 proximate an electronic component that is desired to be cooled. The conduits 28 may be coupled to the cooling modules and the heat exchangers in any manner so as to form a substantially leak free connection. In the exemplary embodiment of cooling system 20 illustrated in FIG. 3, the conduits 28 are illustrated as being attached at corresponding cavities on the cooling modules and the heat exchangers. Any attachment mechanism (brazing, soldering, use of sealing rings, etc.) may be used reduce the likelihood of leaks at the interface of a component and the conduit 28. In some embodiments, as illustrated in FIG. 2, some or all the conduits 28 may have a substantially rectangular cross-section or another cross-section (elliptical, Δ-shaped, ∩-shaped etc.) with an increased width and a reduced height. Such a cross-sectional shape may enable the height of the cooling system 20 to be reduced while increasing the surface area of the conduit 28 that faces the motherboard 14 (see FIG. 1). Reducing the height of the cooling system may enable the cooling system 20 to be used in space constrained computers (or other devices). And, in embodiments where the conduits 28 are made of a thermally conductive material, increasing the surface area of the conduit 28 that faces the motherboard 14 may allow some heat generating components (or relatively hot regions of the motherboard 14) to be cooled by heat transfer with a conduit 28.

Figure 4A:
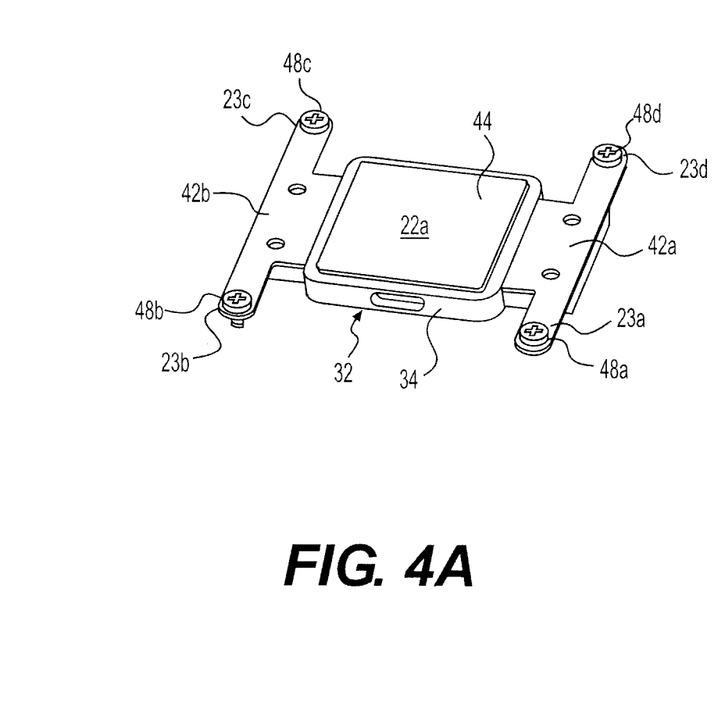
FIG. 4A is a perspective view of a cooling module of the cooling system of FIG. 2.
Figure 4B:
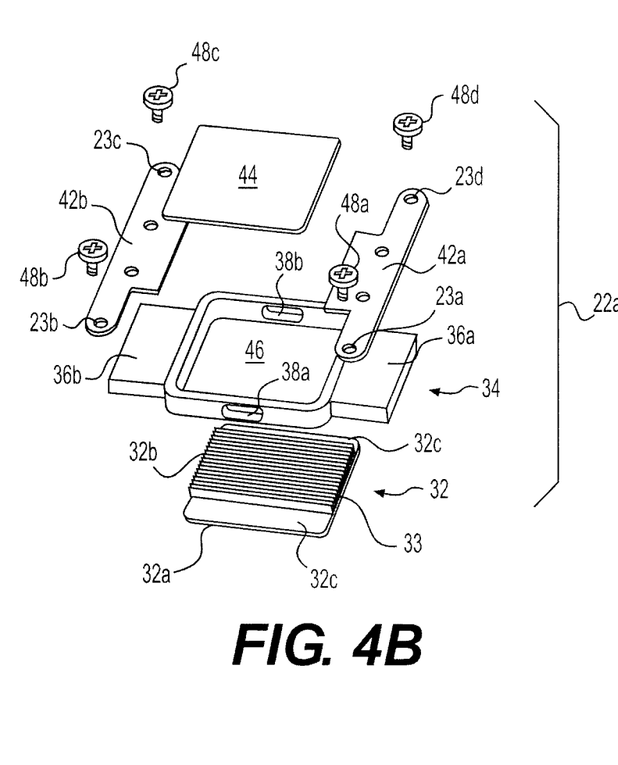
FIG. 4B is an exploded view of the cooling module of FIG. 4A

FIGS. 4A and 4B illustrate perspective and exploded views of an exemplary first cooling module 22a that may used with cooling system 20. Although the first cooling module 22a is described, the same description applies to the second and the third cooling modules 22b, 22c. In the discussion that follows, reference will be made to both FIGS. 4A and 4B. First cooling module 22a may include a top plate 44, a housing 34, and a cold plate 32 that collectively define a reservoir 46 for the coolant therebetween. Housing 34 may include an inlet 38a and an outlet 38b that allow the coolant to enter and exit the reservoir 46. First cooling module 22a may also include side members (first side member 42a and second side member 42b) that serve to keep the first cooling module 22a in intimate thermal contact with the IC device on the motherboard 14. These side members may interface with side arms (first side arm 36a and second side arm 36b) of the housing 34 to apply a downward force on the housing 34 and keep the first cooling module 22a in thermal contact with the IC device. The first and second side members 42a and 42b may include the attachment holes (23a, 23b, 23c, 23d, etc.) that are used to attach the first cooling module 22a to the motherboard 14.

Fasteners (48a, 48b, 48c, and 48d) may pass through corresponding attachment holes (23a, 23b, 23c, 23d) on the side members and the motherboard 14 to attach the first cooling module 22a to the motherboard 14. Varying the torque on the fasteners (48a, 48b, 48c, and 48d) will vary the downward force that the side members apply on the housing and the resulting pressure that the first cooling module 22a applies on the IC device. Although two side members that mate with two side arms of the housing 34 are illustrated in FIGS. 4A and 4B, this is only exemplary and in other embodiments, a different attachment scheme may be employed. For instance, in some embodiments, an X shaped side member with attachment holes at four corners may interface with the top plate 44 to apply a downward force on the first cooling module 22a. In some embodiments, a separate side member may be eliminated and fasteners may pass through attachment holes on the housing 34 to attach the first cooling module 22a to the motherboard 14. The housing 34 and the first and second side members 42a, 42b may be made of any material known in the art. In some embodiments the first and second side members 42a, 42b may be made of a metallic or a nonmetallic elastic material that may elastically deform to apply a downward force on first cooling module 22a. Although not a requirement, fabricating the first and second side members 42a, 42b using an elastic material may allow the cooling module to be attached and detached from the motherboard 14 multiple times without having to replace the side members.

The cold plate 32 of the first cooling module 22a is configured to be in thermal contact with, and conduct heat from, an IC device of motherboard 14. Any heat conducting material (such as, for example, copper, aluminum, etc.) may be used to fabricate cold plate 32. Cold plate 32 may include a first surface 32a that is configured to be in thermal contact with the heat-generating electronic component and a second surface 32b (that is opposite the first surface 32a) that forms a boundary wall of the reservoir 46. The second surface 32b may transfer the heat absorbed by the first surface 32a from the IC device to the coolant in reservoir 46. The second surface 32b may include fins 33 that project into the reservoir 46 from the second surface 32b. These fins 33 increase the surface area of the second surface 32b that is in contact with the coolant in the reservoir 46 and thereby enhance heat transfer to the coolant. The fins 33 also create turbulence in the coolant in the reservoir 46. Turbulence in the coolant flow disrupts the boundary layer at the interface between the coolant and the second surface 32b and increases the heat transfer between the second surface 32b and the coolant. In place of, or in addition to fins 33, second surface 32b may include other features (such as, channels, surface irregularities, micropins, etc.) that are configured to increase the heat transfer. Second surface 32b may also include a flat region 32c on either side of the fins 33 that mate and attach with a mating region on the housing 34. To attach cold plate 32 to housing 34, fins 33 of the second surface 32b may be positioned to protrude into a cavity of the housing 34 that forms the reservoir 46, and the flat surface 32c of the cold plate 32 attached with the mating surface of the housing 34. These surfaces may be attached together in any manner, such as, for example, using an adhesive, solder, braze, or by another known mechanism.

The top plate 44 may serve as a lid to enclose the reservoir 46 and may be made of any material. The top surface 44 may also be attached to the housing 34 in any known manner that forms a substantially liquid-tight seal. Although the top plate 44 is illustrated as a separate component in FIG. 4B, this is not a requirement. In some embodiments, the top plate 44 may be integrated with the housing 34. It is also contemplated that, in some embodiments, a separate cooling module may be eliminated and a suitably shaped region of the conduit will thermally contact and absorb heat from an IC device on the motherboard 14.

Referring to FIG. 2, the coolant may absorb heat at a cooling module (for example, at first cooling module 22a) and flow downstream to a heat exchanger (for example, first heat exchanger 26a). These heat exchangers may absorb heat from the passing coolant and transfer the heat to ambient air. Although any type of liquid to air heat exchanger known in the art may be used as the heat exchangers for cooling system 20, in preferred embodiments, an internally finned liquid to air heat exchanger may be used.

Figure 5A:
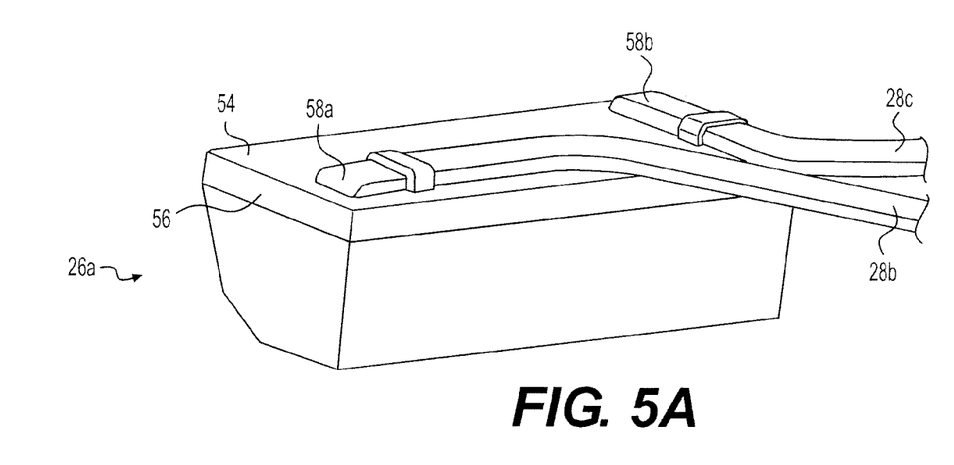
FIG. 5A is an exploded view of a heat exchanger of the cooling system of FIG. 2.
Figure 5B:
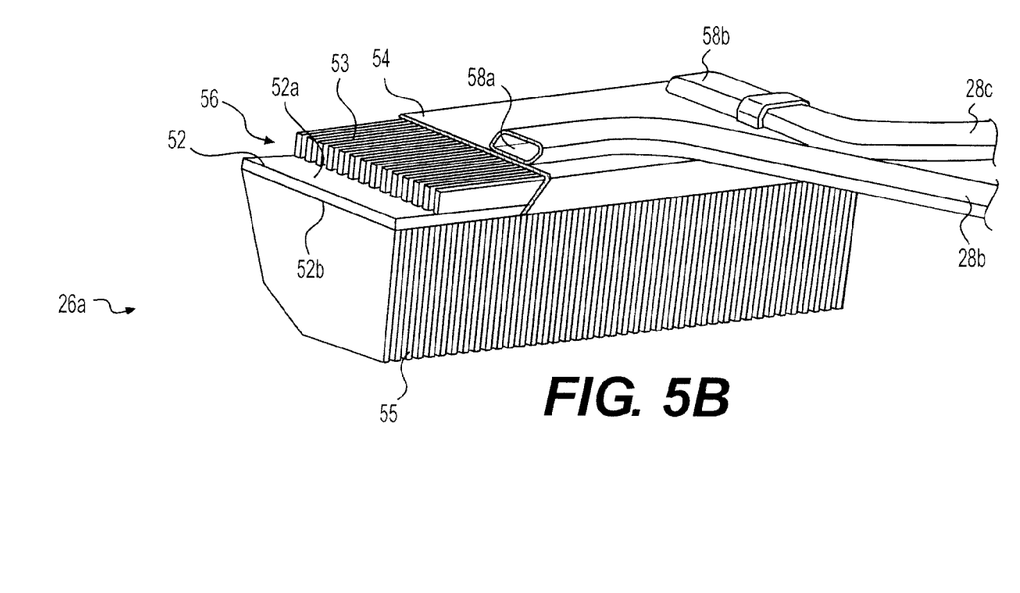
FIG. 5B is another exploded view of the heat exchanger of FIG. 5A.

FIGS. 5A and 5B illustrate an embodiment of an internally finned first heat exchanger 26a that may be used in cooling system 20. Although the first heat exchanger 26a is described herein, the same description is applicable to the second and the third heat exchangers 26b, 26c. FIG. 5A shows a perspective view of the first heat exchanger 26a, while FIG. 5B shows a view of the first heat exchanger 26a with its cover partially removed to show the structure within. In the description below, reference will be made to both FIGS. 5A and 5B. The first heat exchanger 26a may include a conductive plate 52 and a cover 54. The conductive plate 52 may be made of any thermally conductive material (such as, for example, copper, aluminum, etc) and the cover 54 may be made of either a conductive or a non-conductive material. The cover 54 and the conductive plate 52 may attached together to define a reservoir 56 therebetween. The cover 54 may be attached to the conductive plate 52 in any manner, such as, for example, using an adhesive, solder, braze, or by another known mechanism. Similar to reservoir 46 of the first cooling module 22a (described with reference to FIGS. 4A and 4B), the coolant may circulate through reservoir 56 of the first heat exchanger 26a. The cover 54 may include openings for an inlet 58a and an outlet 58b for reservoir 56. Conduits 28b and 28c couple with the inlet 58a and the outlet 58b to direct the coolant into and out of the reservoir 56. The size of the heat exchanger may be selected so that the cooling system 20 can fit within the available space within computer 10 while providing the necessary surface area for cooling.

Conductive plate 52 of first heat exchanger 26a may include a first surface 52a and an opposing second surface 52b. First surface 52a may include fins 53 that project from the first surface 52a into the reservoir 56. These fins 53 may include multiple plates oriented parallel to each other. These fins 53 may be adapted to absorb heat from the coolant that passes through reservoir 56. The multiple parallel plates of the fins 53 may function to increase the area of contact of the coolant to the first surface 52a and serve to generate turbulence in the coolant flowing through the reservoir 56. Although the fins 53 are depicted as parallel plates in FIG. 5B, as described with reference to fins 33 of the first cooling module 22a (see FIG. 4B), first surface 52a may include other structures (such as micropins, etc.) in addition to, or in place of, fins 53. Conductive plate 52 may mate with the cover 54 and form a liquid-tight seal. Although FIGS. 5A and 5B depict the cover to fit over the conductive plate 52 to form reservoir 56, this is not a requirement. In general, the cover 54 and the conductive plate 52 may be attached in any manner to form a substantially liquid-tight seal. For example, in some embodiments, flat regions of the conductive plate 52 may be attached to mating flat regions of the cover 54 to form a substantially liquid-tight seal (for example, similar to the attachment of the cold plate 32 to the housing 34 of the first cooling module 22a described with reference to FIG. 4B).

Second surface 52b of conductive plate 52 may also include fins 55. These fins 55 may also include multiple plates that are oriented parallel to each other. Without limitation, the parallel plates of fins 55 may be oriented in any direction with respect to the parallel plates of fins 53 on the first surface 52a. In some embodiments, the parallel plates of fins 55 may be oriented substantially perpendicular with respect to the parallel plates of fins 53, while in some other embodiments, the plates of fins 55 may be substantially parallel to the plates of fins 55. During operation, the coolant in reservoir 56 may flow in between the multiple plates of fins 53 on the first surface 52a. As the hot coolants interacts with the fins 53, heat from the relatively hotter coolant may get transferred to relatively cooler fins 53, thereby cooling the coolant. Meanwhile, on the opposite surface of the conductive plate 52, ambient air may flow past the multiple plates of fins 55. As the air flows across fins 55, heat transfer between the fins 55 and the air occur and cool fins 55. In this manner, the first heat exchanger 26a may transfer heat from the coolant to ambient air. In some embodiments, a fan coupled to computer 10 may blow air past fins 55 to cool first heat exchanger 26a.

Although fins 53 on first surface 52a, and fins 55 on the second surface 52b, are described to include parallel plates, this is not a requirement. In general, one or both of fins 53 and 55 may include plates or other structures oriented in any direction that allow air and the coolant to flow between them. In place of, or in addition to plates, first surface 52a and the second surface 52b may include any type of features that are adapted to transfer heat from one medium to another. For example, in some embodiments, the fins on one or both of first surface 52a and the second surface 52b may be replaced with, or additionally include other protruding features such as pins. These pins may assist in transfer of heat from the coolant to first heat exchanger 26a, and from the first heat exchanger 26a to ambient air. In some embodiments, the pattern of fins 53 on first surface 52a and/or fins 55 on the second surface 52b may be configured to tailor the fluid flow proximate the fins to achieve a desired level of heat transfer. Although the plates of fins 53 and 55 are illustrated to be continuous in FIGS. 5A and 5B, this is not a requirement. In some embodiments, some or all of plates of fins 53 and 55 may be made up of multiple segments with gaps between them. In some embodiments, all the heat exchangers of liquid cooling system 20 may be identical, while in other embodiments, they may be different. In general, in embodiments of cooling system 20 that include multiple heat exchangers, each heat exchanger may be adapted to fit in the available space and configured to provide the desired cooling capability.

Referring again to FIG. 2, liquid cooling system 20 may include a pump 30 to circulate the coolant through the multiple cooling modules and the heat exchangers. Pump 30 may be any pump that can be used to circulate a coolant through cooling system 20. Since pumps capable of this function are known in the art, extensive discussion of pump 30 is not provided herein. Pump 30 may be adapted to discharge the coolant into conduit 28a and receive the coolant from conduit 28g. To integrate the pump 30 with the cooling system 20, conduits 28a and 28g may be coupled to corresponding openings in the pump 30. Any known method of coupling (such as, for example, using couplings, interference fitting, attachment using an adhesive or another medium, etc.) may be used to couple pump 30 with cooling system 20. In some embodiments, to minimize coolant leaks from cooling system 20, a sealing member, such as for example an o-ring, (not shown) may also be positioned between the conduits and the corresponding openings in the pump 30. The size of the pump may be adapted to fit within the available space of computer 10.

In some embodiments, one or more of the constituent components of the cooling system may be formed together as one part. For instance, as described earlier, in some embodiments some or all of the discrete cooling modules may be eliminated, and a region of the conduit may be shaped and positioned to function similar to the described cooling module. Additionally or alternatively, in some embodiments, one or more of the heat exchangers (such as, first heat exchanger 26a, second heat exchanger 26b, and third heat exchanger 26c) may also be integrated with the conduits. In these embodiments, a region of the conduit may be shaped and configured to serve a function similar to the described heat exchanger. In these embodiments, fins or other structures may also be incorporated into the conduit to increase heat transfer.

Figure 6A:
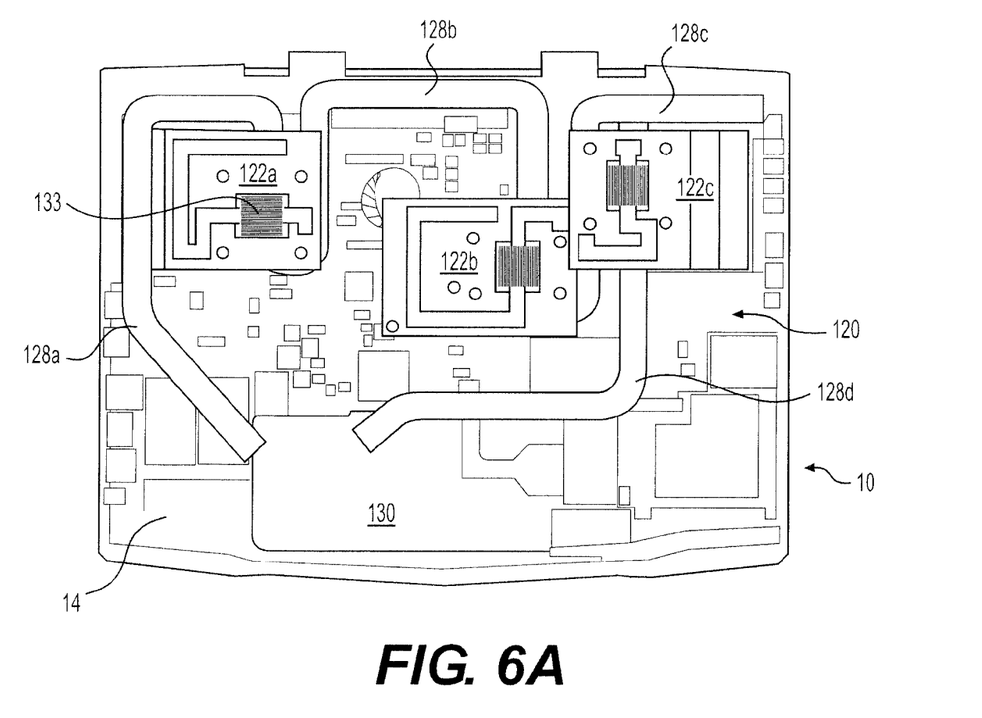
FIG. 6A is an illustration of another embodiment of the disclosed liquid cooling system.
Figure 6B:
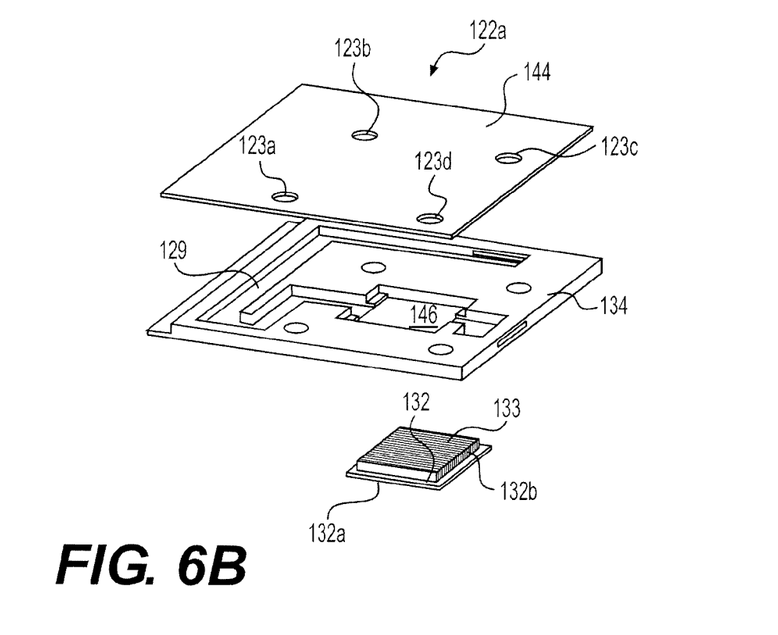
FIG. 6B is an exploded view of an exemplary cooling of the cooling system of FIG. 6A.

FIGS. 6A and 6B illustrate another embodiment of cooling system 120 which includes multiple cooling modules 122a, 122b, 122c that are coupled together and to a pump 130 using conduits 128a, 128b, 128c, 128d, etc. These conduits may be rigid or flexible. Each module may be attached to the motherboard 14 of computer 10 using threaded fasteners (or another known mechanism) passing through attachment holes 123a, 123b, 123c, 123d, etc. As illustrated in the exploded view of cooling module 120a in FIG. 6B, each cooling module may include a housing 134, having a channel 129 enclosed therein, and a top plate 144. The channel 129 may include a section that is shaped to form a reservoir 146 in a region of the housing 134. A cold plate 132 may be coupled to the housing 134 to form a boundary wall of the reservoir 146. The side (second surface 132b) of the cold plate 132 facing the reservoir 146 may include fins 133 or other similar features to enhance heat transfer to the coolant, and an opposite side of the cold plate 132 (first surface 132a) may be configured to be in thermal contact with, and conduct heat from, an IC device on mother board 14. In some such embodiments, the cooling modules (which may be larger than an IC device that the cooling module interfaces with) may provide rigidity to sections of the motherboard 14 that the cooling modules are attached to. Further, in some such embodiments where the housing (for example, housing 134 of first cooling module 122a) is made of a thermally conductive material, the surface of the housing proximate the motherboard 14 may also be used to cool relative hot regions of the motherboard 14.

Although not illustrated in FIGS. 6A and 6B, similar to cooling system 20 of FIG. 2, one or more heat exchangers may also be coupled to cooling system 120 of FIGS. 6A and 6B. For example, similar to the embodiment illustrated in FIG. 2, a first heat exchanger (not shown) may be coupled to conduit 128b in the fluid flow path from the first cooling module 122a to the second cooling module 122b, a second heat exchanger may be coupled to conduit 128c in the fluid flow path from the second cooling module 122b to the third cooling module 122c, and a third heat exchanger may be coupled to conduit 128d in the fluid flow path from the third cooling module 122c to pump 130. By positioning a heat exchanger between two cooling modules the absorbed heat from a first cooling module may be dissipated before the coolant is directed to a second cooling module to absorb more heat. Additionally, alternating a cooling module and a heat exchanger in the fluid flow path increases cooling efficiency by allowing the coolant to be cooled at multiple heat exchangers located in the fluid flow path.

It will be apparent to those skilled in the art that various modifications and variations can be made to the disclosed cooling systems. Other embodiments will be apparent to those skilled in the art from consideration of the specification and practice of the disclosed cooling systems. It is intended that the specification and examples be considered as exemplary only, with a true scope being indicated by the following claims and their equivalents.

What is claimed is:

1. A liquid cooling system for an electronic system, comprising:
   a plurality of cooling modules, wherein at least one cooling module of the plurality of cooling modules is configured to be coupled to a circuit board of the electronic system and placed in thermal contact with at least one heat-generating electronic component on the circuit board, wherein each cooling module is adapted to pass a liquid coolant therethrough;
   a plurality of heat exchangers that are configured to dissipate heat from the liquid coolant to air; and
   a plurality of conduits that fluidly couple the plurality of cooling modules to the plurality of heat exchanger, such that the liquid coolant discharged from each cooling module passes through a heat exchanger before entering another cooling module.

2. The liquid cooling system of claim 1, wherein each conduit of the plurality of conduits is made of a rigid material.

3. The liquid coolant system of claim 2, wherein the at least one conduit is made of a metallic material.

4. The liquid coolant system of claim 1, wherein each heat exchanger of the plurality of heat exchangers includes a first surface having parallel plates that are configured to be at least partially submerged in the liquid coolant and a second surface having separate parallel plates that are exposed to air.

5. The liquid cooling system of claim 4, wherein the first surface is opposite the second surface.

6. The liquid cooling system of claim 4, wherein the parallel plates on the first surface are oriented perpendicular to the parallel plates of the second surface.

7. The liquid cooling system of claim 1, further including a pump that is configured to circulate the liquid coolant through the plurality of cooling modules and the plurality of heat exchangers.

8. The liquid coolant system of claim 1, wherein each heat exchanger of the plurality of heat exchangers is coupled to the circuit board.

9. The liquid coolant system of claim 1, wherein at least one conduit of the plurality of conduits has a substantially rectangular cross-sectional shape and the at least one conduit is oriented such that a wider side of the substantially rectangular cross-section is positioned facing the circuit board.

10. A portable electronic device, comprising:
    a console;
    a circuit board positioned within the console of the portable electronic device, the circuit board including a plurality of heat-generating electronic components thereon;
    a plurality of cooling modules coupled to the circuit board and in thermal contact with a plurality of heat generating components on the circuit board, wherein each cooling module of the plurality of cooling modules is configured to pass a liquid coolant therethrough; and
    a plurality of heat exchangers fluidly coupled to the plurality of cooling modules such that the liquid coolant discharged from each cooling module passes through a heat exchanger before entering another cooling module, the plurality of heat exchangers adapted to dissipate heat from the liquid coolant to air.

11. The portable electronic device of claim 10, further including a plurality of conduits that fluidly couple the plurality of cooling modules to the plurality of heat exchangers.

12. The portable electronic device of claim 11, wherein the plurality of conduits are made of a rigid material such that the plurality of cooling modules and the plurality of heat exchangers can be placed on and attached to the circuit board as one single unit.

13. The portable electronic device of claim 10, wherein each heat exchanger of the plurality of heat exchangers is positioned at an edge of the circuit board.

14. The portable electronic device of claim 10, further including a pump that is configured to circulate the coolant between the plurality of cooling modules and the plurality of heat exchangers, the pump being positioned within the console.

15. The portable electronic device of claim 10, wherein the plurality of cooling modules include three cooling modules and the plurality of heat exchangers include three heat exchangers.

16. The portable electronic device of claim 10, wherein a cross-section of at least one conduit of the plurality of conduits is substantially rectangular and the at least one conduit is oriented such that a wider side of the substantially rectangular cross-section is positioned facing the circuit board.

17. A liquid cooling system for an electronic system, comprising:
    a plurality of cooling modules that are configured to be coupled to a circuit board of the electronic system and placed in thermal contact with a plurality of heat-generating electronic components on the circuit board, wherein each cooling module of the plurality of cooling modules is adapted to pass a liquid coolant therethrough; and
    a plurality of heat exchangers that are fluidly coupled to the plurality of cooling modules such that the liquid coolant discharged from each cooling module passes through a heat exchanger before entering another cooling module, the plurality of heat exchangers being configured to dissipate heat from the plurality of heat generating components to air, wherein each heat exchanger of the plurality of heat exchangers includes a first surface having parallel plates that are configured to be at least partially submerged in the liquid coolant and a second surface opposite the first surface having separate parallel plates that are exposed to air.

18. The liquid cooling system of claim 17, further including a plurality of metallic conduits that fluidly couple the plurality of cooling modules to the plurality of heat exchangers.

19. The liquid cooling system of claim 17, wherein each conduit of the plurality of conduits has a substantially rectangular cross-sectional shape.

20. The liquid cooling system of claim 17, further including a pump that is configured to circulate the coolant between the plurality of cooling modules and the plurality of heat exchangers.

* * * * *